United States Patent [19]

Wrathall et al.

[11] Patent Number: 4,701,718
[45] Date of Patent: Oct. 20, 1987

[54] CMOS HIGH GAIN AMPLIFIER UTILIZING POSITIVE FEEDBACK

[75] Inventors: Robert S. Wrathall, Tempe; Judy L. Sutor, Phoenix, both of Ariz.

[73] Assignee: Motorola Inc., Schaumburg, Ill.

[21] Appl. No.: 509,574

[22] Filed: Jun. 30, 1983

[51] Int. Cl.[4] .......................... H03F 3/16; H03F 3/45
[52] U.S. Cl. .................................... 330/253; 330/277
[58] Field of Search ............... 330/253, 277, 264, 288, 330/291, 292, 260

[56] References Cited
FOREIGN PATENT DOCUMENTS
8027685 7/1982 France ................................. 330/253

OTHER PUBLICATIONS

Tsividis et al. "A Process-Insensitive Hi-Performance NMOS OpAmp" *IEEE J. S. S. Cicts.* vol. SC-13, n. 6, Dec. 1980 pp. 921-928.

*Primary Examiner*—Eugene R. LaRoche
*Assistant Examiner*—Steven J. Mottola
*Attorney, Agent, or Firm*—William J. Kubida

[57] ABSTRACT

A CMOS operational amplifier comprises an input stage for receiving first and second potentials, a bias stage and first and second gain stages. In order to improve the frequency response, capacitors are employed to provide positive feedback. The biasing stage maintains the output in its active region, and avoids the necessity of external biasing.

6 Claims, 1 Drawing Figure

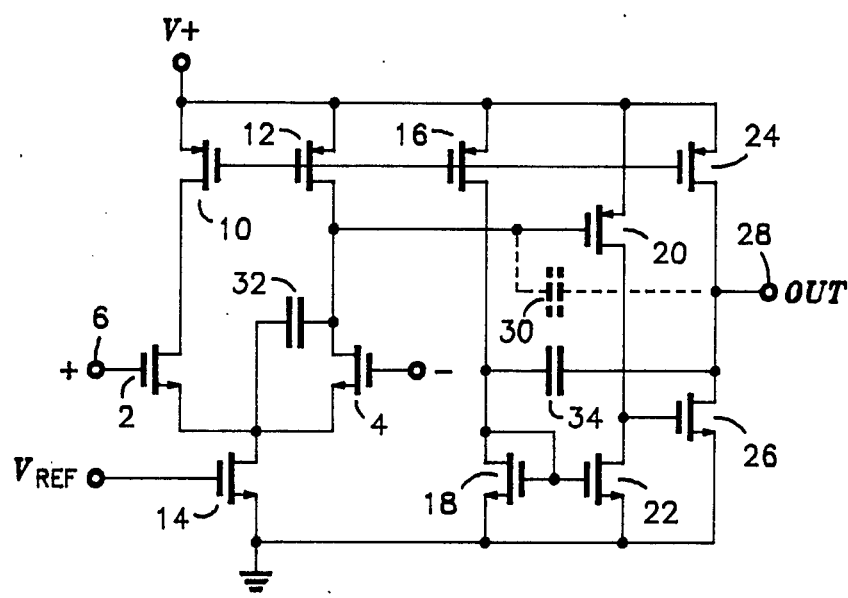

CMOS HIGH GAIN AMPLIFIER UTILIZING POSITIVE FEEDBACK

BACKGROUND OF THE INVENTION

This invention relates generally to amplifiers and, more particularly, to a complementary metal oxide semiconductor (CMOS) operational amplifier characterized by high speed and high gain.

The advantages offered by CMOS technology over bipolar technology are well known (e.g. higher density, lower power, greater yield, etc.). These characteristics are extremely important in the design and fabrication of complex digital integrated circuits; for example, single chip microprocessors.

Whereas digital circuitry is generally characterized by its "on/off" or "1/0" nature, most measurements in the real world are inherently analog; e.g., temperature, pressure, speed, voltage, etc. Therefore, it is necessary that microprocessors and other digital circuitry communicate or interfacing with analog circuitry such as amplifiers, buffers, comparators, etc. in order to permit digital processing of the analog signals. The required interfacing may be accomplished by providing analog components which are external to the microprocessor chip. However, such arrangements generally require more current, a larger power supply and commonly present more opportunities for design and manufacturing errors. To avoid these disadvantages, complex analog circuits such as operational amplifiers are being manufactured integrally with the digital circuitry; e.g., on the microprocessor chip itself, and due to the complex nature of microprocessors, the inclusion of analog devices on the same chip requires that the same manufacturing process be employed. Thus, an operational amplifier included on a CMOS microprocessor chip must be fabricated in accordance with CMOS processing techniques, and the design of the operational amplifier must be tailored to such processing techniques.

CMOS operational amplifiers have been characterized as having significantly slower speeds than their bipolar counterparts and, in addition, have less gain. In fact, increasing gain in accordance with prior art techniques generally requires further reductions in speed; i.e. to increase gain the amplifier must be operated at lower current which means higher impedances and therefore longer time constants. In the past, performance speed has been increased at the expense of gain. The gain could in turn be increased by cascading amplifiers; however, such an arrangement is not suitable for closed loop applications due to excess phase shift resulting in an unstable circuit.

SUMMARY OF THE INVENTION

It is an object of the present invention to provide an improved CMOS operational amplifier circuit.

It is a further object of the present invention to provide a CMOS operational amplifier characterized by high gain and high speed.

It is a still further object of the present invention to provide a CMOS operational amplifier characterized by gain and speed which is comparable to that of its bipolar counterparts.

BRIEF DESCRIPTION OF THE DRAWINGS

The above and other objects, features, and advantages of the present invention will be more clearly understood from the following detailed description taken in conjunction with the accompanying drawing which is a schematic diagram of the inventive CMOS operational amplifier.

DESCRIPTION OF THE PREFERRED EMBODIMENT

The circuit shown in the FIGURE comprises an input stage having gain, a bias stage, first and second gain stages, and compensation capacitors. The input stage comprises first and second input N-channel field effect transistors (FETS) 2 and 4 respectively. Transistor 2 has a gate coupled to a noninverting input terminal 6, and the gate of transistor 4 is coupled to an inverting input terminal 8. First and second P-channel field effect transistors 10 and 12 are coupled in current mirror forming relationship with transistors 2 and 4. That is, the source electrodes of transistors 10 and 12 are coupled to a source of supply voltage V+ while their drain electrodes are coupled respectively to the drain electrodes of transistors 2 and 4. The drain electrode of transistor 10 is likewise coupled to its gate electrode. An N-channel field effect transistor 14 has a drain coupled to the sources of transistors 2 and 4, a source coupled to a second source of supply voltage (in this case ground), and a gate coupled to a reference voltage ($V_{REF}$). Transistor 14 acts as a current sink and is maintained active by properly choosing the value of $V_{REF}$ in accordance with well known techniques.

The amplifier's bias stage includes a third P-channel field effect transistor 16 having a source coupled to V+, a gate coupled to the gate electrodes of transistors 10 and 12 in the input stage, and a drain coupled to the drain of N-channel field effect transistor 18. The drain of transistor 18 is also coupled to its gate, and the source of transistor 18 is coupled to ground.

The first gain stage includes P-channel field effect transistor 20 and N-channel field effect transistor 22. Transistor 20 has a source coupled to V+, a gate coupled to the drains of transistors 4 and 12 in the input stage, and a drain coupled to the drain of transistor 22. The source of transistor 22 is coupled to ground and its gate is coupled to the gate of transistor 18 in current mirror forming relationship therewith.

The final gain stage includes P-channel field effect transistor 24 and N-channel field effect transistor 26. The source of transistor 24 is coupled to V+, its gate is coupled to the gates of transistors 10, 12 and 16 and its drain is coupled to output terminal 28 and to the drain of transistor 26. The gate of transistor 26 is coupled to the drain of transistor 22, and the source of transistor 26 is coupled to ground.

The circuit operates as follows. If the input voltages at terminals 6 and 8 are equal, equal currents will flow through transistors 2 and 4. If all the devices are of the same size and same threshold, the drain voltages of transistors 10 and 12 will be equal due to the operation of the current mirror. The current flowing through transistor 10 will also be mirrored by transistors 16 and 24. However, since different voltages are being dropped across transistors 10 and 16, their drain currents will be slightly different, and the current flowing through transistor 18 will be larger than that flowing through transistor 10. Since the voltages appearing at the drains of the transistors 10 and 12 are equal, the current flowing through transistor 20 will likewise mirror the current flowing through transistor 10. Therefore, the voltages appearing at the drains of transistors 16, 20 and 24 will be equal. Since, as stated previously, the current flowing through transistor 18 is slightly greater than that flowing through transistor 16, the output of the circuit is biased in its active region, and such biasing will track with variations in temperature and process parameters.

If the voltage at terminal 6 rises above that of terminal 8, transistor 2 (and therefore transistor 10) will conduct more current causing transistor 6 to conduct more current. However, since the voltage at the drain of transistor 14 increases, the current flowing through transistor 4 will decrease. This causes the voltage at the drain of transistor 12 to increase which in turn causes the current flowing through transistor 20 to decrease.

Since the currents flowing through transistors 16, 18, 22, and 24 follow that which is flowing through transistor 10, each of their currents will increase. Therefore, the voltage appearing at the drain of transistor 22 is pulled down. This causes the current flowing through transistor 26 to decrease while that flowing through transistor 24 remains the same. Thus, the output voltage appearing at terminal 28 will increase.

In contrast, if the voltage appearing at inverting terminal 8 should increase above that appearing at noninverting terminal 6, the current flowing through transistor 4 will increase and the currents flowing through transistors 2, 10 and 12 will decrease. This causes the voltage at the drain of transistor 12 to fall turning transistor 20 on harder. Since the current flowing through transistor 10 decreases, the currents flowing through transistors 18 and 22 will likewise decrease. However, since transistor 20 is conducting more current, the voltage appearing at the drain of transistor 22 will increase turning transistor 26 on harder. Transistor 11, on the other hand, mirrors the current flowing through transistor 10 and therefore conducts less current. This, coupled with the fact that transistor 26 is conducting more current, will cause the voltage appearing at output terminal 28 to go low.

If the circuit shown in the drawing is not provided with compensation means, a double pole will cause the frequency response to roll off and become unstable. Typically, this is compensated for by means of a pole splitting capacitor which moves the roll-off point back. Unfortunately, this degrades the frequency response and results in a reduced gain/bandwidth product.

The inventive circuit shown in the drawing provides compensation by means of connecting either capacitor 30 (shown dotted) between the gate of transistor 20 and output terminal 28 or by the connection of capacitors 32 and 34 between the source and drain of transistor 4 and the drains of transistors 18 and 26 respectively. The capacitors provide positive feedback loops which compensate for the poles and the circuit becomes stable at the unity gain frequency. Thus, the frequency response and therefore the speed of the circuit is greatly improved. In addition, due to the gain stages in the circuit, the circuit exhibits a high gain.

The above description is given by way of example only. Changes in form and details may be made by one skilled in the art without departing from the scope of the invention as defined by the appended claims.

We claim:

1. A CMOS operational amplifier of the type which includes an inverting input, a non-inverting input and an output, comprising:

an input stage including a first input N-channel field effect transistor having a gate coupled to said non-inverting input, and having source and drain electrodes; a second N-channel field effect transistor having a gate coupled to said inverting input and having source and drain terminals; a third N-channel field effect transistor having a gate coupled to a source of a reference voltage, a drain coupled to the sources of said first and second transistors, and a source coupled to a first source of supply voltage; a first P-channel field effect transistor having a source coupled to a second source of supply voltage and having a gate coupled to its drain and to the drain of said first N-channel field effect transistor; and a second P-channel field effect transistor, having a source coupled to said second source of supply voltage, a gate coupled to the gate of said first P-channel field effect transistor and a drain coupled to the drain of said second N-channel field effect transistor, said first and second P-channel field effect transistors being coupled in current mirror relationship with said first and second N-channel field effect transistors and said third N-channel field effect transistor acting as a current sink;

a bias stage coupled between said output and said input stage for internally biasing said output in its active region;

a first gain stage coupled to said bias stage and to said input stage;

a second gain stage coupled to said input stage, said first gain stage and to said output; and a first capacitor coupled between said output and the input of said first gain stage for producing positive feedback and improving the frequency performance of said amplifer.

2. A CMOS operational amplifier of the type which includes an inverting input, a non-inverting input and an output, comprising:

an input stage including a first input N-channel field effect transistor having a gate coupled to said non-inverting input and having source and drain electrodes; a second N-channel field effect transistor having a gate coupled to said inverting input and having source and drain terminals; a third N-channel field effect transistor having a gate coupled to a source of a reference voltage, a drain coupled to the sources of said first and second transistors, and a source coupled to a first source of supply voltage; a first P-channel field effect transistor having a source coupled to a second source of supply voltage and having a gate coupled to its drain and to the drain of said first N-channel field effect transistor; and a second P-channel field effect transistor having a source coupled to said second source of supply voltage, a gate coupled to the gate of said first P-channel field effect transistor, and a drain coupled to the drain of said second N-channel field effect transistor, said first and second P-channel field effect transistors being coupled in current mirror relationship with said first and second N-channel field effect transistors and said third N-channel field effect transistor acting as a current sink;

a bias stage coupled between said output and said input stage for internally biasing said output in its active region;

a first gain stage coupled to said bias stage and to said input stage;

a second gain stage coupled to said input stage, said first gain stage and to said output; and a second capacitor coupled between said output and said bias stage for producing positive feedback and improving the frequency performance of said amplifier.

3. The CMOS operational amplifier according to claim 2 wherein said compensation means further includes a third capacitor coupled between the source and drain electrodes of said second N-channel field effect transistor.

4. A CMOS operational amplifier according to claim 1 wherein said bias stage comprises:
- a third P-channel field effect transistor having a gate coupled to the gates of said first and second P-channel field effect transistors, a source coupled to the second source of supply voltage and having a drain; and
- a fourth N-channel field effect transistor having a drain coupled to its gate and to the drain of said third P-channel field effect transistor and having a source coupled to said first source of supply voltage.

5. A CMOS operational amplifier according to claim 4 wherein said first gain stage comprises:
- a fourth P-channel field effect transistor having a source coupled to said second source of supply voltage, a gate coupled to the drains of said second N-channel field effect transistor and said second P-channel field effect transistor, and having a drain; and
- a fifth N-channel field effect transistor having a drain coupled to the drain of said fourth P-channel field effect transistor, a source coupled to said first source of supply voltage and a gate coupled to the gate and drain electrodes of said fourth N-channel field effect transistor.

6. A CMOS operational amplifier according to claim 5 wherein said second gain stage comprises:
- a fifth P-channel field effect transistor having a source coupled to said second source of supply voltage, a gate coupled to the gates of said first, second, and third P-channel field effect transistors and having a drain coupled to said output; and
- a sixth N-channel field effect transistor having a source coupled to said first source of supply voltage, a gate coupled to the drain of said fifth N-channel field effect transistor, and a drain coupled to said output.

* * * * *